United States Patent
Woo

(10) Patent No.: US 10,890,626 B2
(45) Date of Patent: Jan. 12, 2021

(54) POWER MANAGEMENT INTEGRATED CIRCUIT

(71) Applicant: SILICON WORKS CO., LTD., Daejeon (KR)

(72) Inventor: Young Jin Woo, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 32 days.

(21) Appl. No.: 16/443,461

(22) Filed: Jun. 17, 2019

(65) Prior Publication Data
US 2019/0383884 A1  Dec. 19, 2019

(30) Foreign Application Priority Data
Jun. 19, 2018  (KR) .................. 10-2018-0070051

(51) Int. Cl.
*G01R 31/40*       (2020.01)
(52) U.S. Cl.
CPC ................... *G01R 31/40* (2013.01)
(58) Field of Classification Search
CPC .............. G01R 31/40; H02M 3/156

USPC ................ 324/764.01, 537, 500
See application file for complete search history.

(56) References Cited

U.S. PATENT DOCUMENTS

| 9,091,741 B2 | 7/2015 | Mora Sanchez |
| 2013/0169310 A1 | 7/2013 | Woo et al. |
| 2015/0138056 A1* | 5/2015 | Woo ............. G09G 3/3696 345/89 |
| 2015/0145493 A1* | 5/2015 | Bhattad ........... G05F 1/562 323/273 |
| 2020/0233443 A1* | 7/2020 | De Vos ............. H02J 3/381 |

FOREIGN PATENT DOCUMENTS

| KR | 10-2013-0068615 A | 6/2013 |
| KR | 10-2013-0130327 A | 12/2013 |

\* cited by examiner

*Primary Examiner* — Giovanni Astacio-Oquendo
(74) *Attorney, Agent, or Firm* — Fenwick & West LLP

(57) ABSTRACT

An embodiment provides a power management integrated circuit including, inside thereof, a capacitor configured to simulate an inductor and multiple current sources configured to simulate an inductor voltage, wherein the power management integrated circuit is capable of testing whether an internal element normally operates without a separate test device including an inductor.

16 Claims, 12 Drawing Sheets

POWER MANAGEMENT INTEGRATED CIRCUIT

CROSS REFERENCE TO RELATED APPLICATION

This application claims priority from Korean Patent Application No. 10-2018-0070051, filed on Jun. 19, 2018, which is hereby incorporated by reference for all purposes as if fully set forth herein.

BACKGROUND OF THE INVENTION

Field of the Invention

The present embodiment relates to a power management integrated circuit.

Description of the Prior Art

Among converters that convert power, a converter that increases an output voltage to be higher than an input voltage and outputs the increased output voltage is referred to as a step-up. In some cases, a step-up converter is also referred to as a boost converter.

In general, a step-up converter has a structure of building up current in an inductor in a first control interval—a time interval corresponding to DT (D is duty, and T is a control period)—and outputting the built-up current to a load in a second control interval—a time interval corresponding to (1−D)T. In practical implementations, because an inductor current cannot be supplied directly to a load, an output capacitor is inserted between the inductor and the load, and the inductor current is supplied to the load via the output capacitor.

Among converters, a converter that decreases an output voltage to be lower than an input voltage and outputs the decreased output voltage is referred to as a step-down. In some cases, a step-down converter is also referred to as a buck converter.

In general, like the step-down converter, a step-down converter also builds up current in an inductor in a first control interval—a time interval corresponding to DT (D is duty, and T is a control period). The step-down converter is different from the step-up converter in that the step-sown converter outputs an inductor current to a load throughout a control period.

As such, a converter has a structure of building up current in an inductor and outputting the built-up inductor current to a load.

The amount of current built up in the inductor is determined depending on the amount of current consumed in the load, and it is considered that the amount of current is controllably determined based on output voltage formed in an output capacitor. The converter controls the amount of current, which is built up in the inductor, to increase when the output voltage becomes lower than a set value, and controls the amount of current, which is built up in the inductor, to decrease when the output voltage becomes higher than the set value.

This control is performed by a Power Management Integrated Circuit (PMIC). The power management integrated circuit controls an inductor voltage formed between both sides of the inductor so as to control the amount of current that is built up in the inductor, and therefore the converter including the inductor outputs voltage according to the set value.

The power management integrated circuit is produced through semiconductor processes and is tested and shipped after a test procedure.

Conventionally, in order to test a power management integrated circuit, a test device including elements used in a converter has been required. In order to test whether the power management integrated circuit performs a proper control according to a feedback voltage, a test device including an inductor has been produced so far. Whether or not the power management integrated circuit is good is determined by identifying whether the power management integrated circuit properly controls an inductor device after the test device is connected to the power management integrated circuit.

However, according to such a conventional test method, there are problems in which: because a test device including an inductor needs to be fabricated, test costs increase; high power consumption occurs due to flowing out a high current to the inductor or the like; and a test time increases because the number of concurrently testable power management integrated circuits is limited.

SUMMARY OF THE INVENTION

Given this background, an aspect of the present embodiment is to provide a technique to increase a test efficiency of a power management integrated circuit. Another aspect of the present embodiment is to provide a technique relating to a power management integrated circuit that can be tested through a low cost test device including no inductor. Still another aspect of the present embodiment is to provide a technique relating to a power management integrated circuit that can be tested with low power. Still another aspect of the present embodiment is to provide a technique relating to a power management integrated circuit enabling testing of multiple power management integrated circuits at the same time.

In view of the described aspects, an embodiment provides a power management integrated circuit which controls a power stage including an inductor to output voltage according to a set value, and includes a feedback control unit, a simulation voltage formation unit, and a simulation voltage output terminal.

The feedback control unit may generate a gate controlling signal for at least one switch so that an inductor voltage formed in the inductor is controlled according to a feedback voltage corresponding to the output voltage of the power stage. The simulation voltage formation unit may form a simulation voltage corresponding to the output voltage according to a simulation controlling signal of the feedback control unit. The simulation voltage output terminal may output the simulation voltage.

The simulation voltage formation unit may simulate the inductor with a first capacitor, and may simulate the inductor voltage with current input/output to the first capacitor. The simulation voltage formation unit may include multiple current sources, and each of the current sources may correspond to voltage formed on one side of the inductor, voltage formed on the other side of the inductor, or voltage formed between the both sides. The simulation voltage formation unit may simulate an output capacitor of the power stage with a second capacitor, and may input/output current corresponding to voltage of the first capacitor and current corresponding to a load to the second capacitor.

Energy stored in the first capacitor may be smaller than energy stored in the inductor.

The feedback voltage or the output voltage may be input to the simulation voltage output terminal in a first mode, and the simulation voltage may be output to the simulation voltage output terminal in a second mode.

Another embodiment provides a power management integrated circuit which controls a power stage including an inductor to output voltage according to a set value, and includes a feedback control unit, a simulation voltage formation unit, and a simulation voltage output terminal.

The feedback control unit may generate a gate controlling signal for at least one switch so that an inductor voltage formed in the inductor is controlled according to a feedback voltage corresponding to the output voltage of the power stage. The simulation voltage formation unit may include a first capacitor that simulates the inductor, and may control current supplied to the first capacitor according to a simulation controlling signal so that voltage of the first capacitor simulates current of the inductor. The simulation voltage output terminal may output the voltage of the first capacitor.

In the power stage, an input voltage of the power stage is supplied to one side of the inductor, and the output voltage and a ground voltage are alternately supplied to the other side of the inductor according to on/off of the at least one switch, and the simulation voltage formation unit may charge the first capacitor with a first current corresponding to the input voltage throughout a control period through a first current source, and may discharge the first capacitor with a second current corresponding to the output voltage through a second current source in a first control interval, in which the first switch is turned off, in the control period. Further, with respect to the second capacitor that simulates the output capacitor of the power stage, the simulation voltage formation unit may supply a third current corresponding to voltage of the first capacitor to a node connected to the second capacitor through a third current source in the first control interval. The simulation voltage formation unit may perform control so that a fourth current source that simulates a load receives a fourth current supplied from the node.

The simulation voltage output terminal may output voltage of the first capacitor only in the first control interval, in which the first switch is turned on, in the control period of the power stage.

A sensing value of current of the inductor may be input to the simulation voltage output terminal in the first mode, and voltage of the first capacitor may be output to the simulation voltage output terminal in the second mode.

In the power stage, the input voltage of the power stage and the ground voltage may be alternately supplied to one side of the inductor according to on/off of the at least one switch, and the output voltage may be supplied to the other side of the inductor. The simulation voltage formation unit may charge the first capacitor with the first current corresponding to the input voltage through the first current source in the first control interval, in which the first switch is turned off, in the control period, and may discharge the first capacitor with the second current corresponding to the output voltage throughout the control period through the second current source. Further, with respect to the second capacitor that simulates the output capacitor of the power stage, the simulation voltage formation unit may supply the third current corresponding to voltage of the first capacitor to the node connected to the second capacitor through the third current source. The simulation voltage formation unit may perform control so that the fourth current source that simulates the load receives the fourth current supplied from the node according to a predetermined clock. Alternatively, the simulation voltage formation unit may control the second capacitor to be discharged through the fourth current source that simulates the load.

Another embodiment provides a power management integrated circuit for regulating output voltage of a power stage using a switch, comprising: a feedback control unit configured to regulate voltage of an inductor included in said power stage by generating a gate controlling signal for said switch in response according to voltage of a feedback terminal connected to an voltage output terminal of said power stage in a power stage driving mode, and to generate said a simulation controlling signal in response according to a simulation voltage formed inside said power management integrated circuit instead of the voltage of said feedback terminal in a test mode; a simulation voltage formation unit comprising a first capacitor to simulate said inductor and generating said simulation voltage by controlling current input into or output from said first capacitor according to said simulation controlling signal of said feedback control unit; and a simulation voltage output terminal to output said simulation voltage to the outside of said power management integrated circuit.

Another embodiment provides a power management integrated circuit for regulating output voltage of a power stage using a switch, comprising: a feedback control unit configured to regulate voltage of an inductor included in said power stage by generating a gate controlling signal for said switch according to voltage of a feedback terminal connected to an voltage output terminal of said power stage in a power stage driving mode, and to generate a simulation controlling signal according to a simulation voltage formed inside said power management integrated circuit instead of the voltage of said feedback terminal in a test mode; a simulation voltage formation unit comprising a first capacitor to simulate said inductor and generating said simulation voltage by controlling current input into or output from said first capacitor according to said simulation controlling signal of said feedback control unit; and a simulation voltage output terminal to output voltage of said first capacitor.

As described above, according to the embodiments, the present disclosure can increase a test efficiency of a power management integrated circuit, lower test costs for the power management integrated circuit through a test device including no inductor, test the power management integrated circuit with low power, and shorten a test time by concurrently testing multiple power management integrated circuits.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EXEMPLARY EMBODIMENTS

Figure 1:
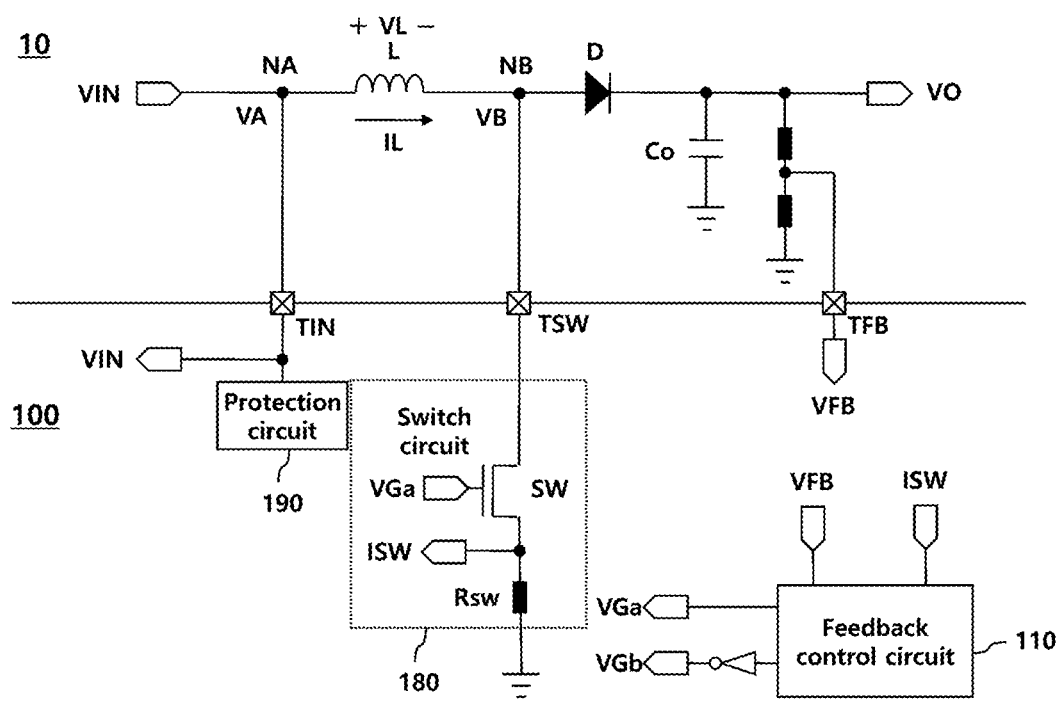
FIG. 1 is a diagram showing a state in which a power management integrated circuit and a power stage are connected according to an embodiment.

Hereinafter, embodiments of the present disclosure will be described in detail with reference to the accompanying drawings. In adding reference numerals to elements in each drawing, the same elements will be designated by the same reference numerals as far as possible, although they are shown in different drawings. Further, in the following description of the present disclosure, a detailed description of known functions and configurations incorporated herein will be omitted when it is determined that the description may make the subject matter of the present disclosure rather unclear.

In addition, terms, such as first, second, A, B, (a), (b) or the like may be used herein when describing components of the present disclosure. These terms are merely used to distinguish one structural element from other structural elements, and a property, an order, a sequence or the like of a corresponding structural element are not limited by the term. When it is described in the specification that one component is "connected," "coupled" or "joined" to another component, it should be read that the first component may be directly connected, coupled or joined to the second component, but also a third component may be "connected," "coupled," and "joined" between the first and second components.

FIG. 1 is a diagram showing a state in which a power management integrated circuit and a power stage are connected according to an embodiment.

Referring to FIG. 1, a power stage 10 may include an inductor L, a diode D, an output capacitor Co, and the like. The power stage 10 may include the inductor L, and may form an output voltage VO by a method of outputting, to the output capacitor Co, an inductor current IL controlled according to an inductor voltage VL formed in the inductor L. In FIG. 1 to FIG. 5, an example of the power stage 10 is described with reference to a step-up converter, but the present disclosure is not limited to such a step-up converter.

A power converting device may comprise of the power stage 10 and a control circuit and the control circuit may be formed of an integrated circuit, wherein the power stage 10 comprises the inductor L, which is a passive element, and may perform a basic power conversion from input voltage to output voltage.

In the power stage 10 of a step-up converter type, an input voltage VIN may be supplied to one-side node NA of the inductor, and the diode D and a first switch SW may be connected to the other-side node NB. An anode electrode of the diode D may be connected to the other-side node NB of the inductor and a cathode electrode of the diode D may be connected to the output capacitor Co, so that conduction may be achieved if voltage (an inductor other-side voltage VB) of the other-side node of the inductor is higher than the output voltage VO.

A drain electrode of the first switch SW may be connected to the other-side node NB of the inductor, and a source electrode of the first switch SW may be connected to ground. A sensing resistor Rsw may be further disposed between the first switch SW and the ground. The first switch SW and the sensing resistor Rsw may be included in the power stage 10, and may be included in the power management integrated circuit 100 as illustrated in FIG. 1. It has been described that the sensing resistor Rsw is used to measure current of the first switch SW, but the sensing resistor Rsw may be replaced with a different current measurement element (for example, an element of the same kind as the first switch SW).

When the first switch SW and the sensing resistor Rsw are included in the power management integrated circuit 100, the other-side node NB of the inductor and the drain electrode of the first switch SW may be connected through a switch node terminal TSW of the power management integrated circuit 100. When the first switch SW and the sensing resistor Rsw are included in the power stage 10, voltage (sensing voltage) formed in the sensing resistor Rsw may be input to the switch node terminal TSW.

The power management integrated circuit 100 may include a feedback control circuit 110, a switch circuit 180, a protection circuit 190, and the like, and may also include an input control terminal TIN, a switch node terminal TSW, a feedback terminal TFB, and the like.

The power management integrated circuit 100 may control the first switch SW so that the output voltage VO of the power stage 10 conforms to a set value. For this control, the power management integrated circuit 100 may receive the output voltage VO or a feedback voltage VFB corresponding to the output voltage VO. As an example in FIG. 1, the power management integrated circuit 100 receives, through the feedback terminal TFB, a feedback voltage VFB in which the output voltage VO is reduced at a predetermined ratio by a feedback branch circuit. As another example, the power management integrated circuit 100 may directly receive the output voltage VO through an output voltage terminal (not illustrated).

The feedback control circuit 110 may compare a feedback voltage VFB with a set value, and may generate a first gate controlling signal VGa for the first switch SW such that the feedback voltage VFB coincides with the set value, and may output the generated first gate controlling signal VGa. For example, if the feedback voltage VFB is higher than the set value, the feedback control circuit 110 may generate the first gate controlling signal VGa so that a ratio of the first control interval, in which the first switch SW is turned on, increases, and may generate the first gate controlling signal VGa so that a ratio of the first control interval decreases if the feedback voltage VFB is lower than the set value.

A second switch (not illustrated) which can be turned on/off may be used instead of the diode D, and the second switch (not illustrated) may be turned on/off as opposed to the first switch SW. For control of the second switch (not illustrated), the feedback control circuit 110 may generate a second gate controlling signal VGb. The second gate controlling signal VGb may have a waveform that is an inverted waveform of the first gate controlling signal VGa.

The switch circuit 180 may include the first switch SW and the sensing resistor Rsw. The first gate controlling signal VGa may be supplied to a gate electrode of the first switch SW, and the sensing voltage ISW of the sensing resistor Rsw may be output to the feedback control circuit 110.

The sensing voltage ISW is a value corresponding to current flowing through the first switch SW, and may correspond to the inductor current IL in the first control interval. The feedback control circuit 110 may identify, through the sensing voltage ISW, the inductor current IL or the current flowing through the first switch SW, and may compare a current setting value with the inductor current IL or the current flowing through the first switch SW, so as to control the first switch SW. This control may be referred to as a current control and, according to the current control, the feedback control circuit 110 may control the inductor current IL or the output current to have a predetermined value, and may perform protection so as to prevent the inductor current IL or the current flowing through the first switch SW from exceeding the predetermined value.

The protection circuit 190 may perform protection to prevent the power management integrated circuit 100 from being damaged by external influences. For example, the protection circuit 190 may perform protection to prevent an input voltage VIN identified through the input voltage terminal TIN from exceeding a predetermined value, and may block introduction of electro-static discharge (ESD) through the input voltage terminal TIN.

By using such configurations in a power stage driving mode, the power management integrated circuit 100 may control the power stage 10 including the inductor L to output voltage according to a set value. Particularly, the feedback control circuit 110 may generate gate controlling signals VGa and VGb for at least one switch SW so that the inductor voltage VL formed in the inductor L is controlled according to the feedback voltage VFB corresponding to the output voltage VO of the power stage 10.

Figure 2:
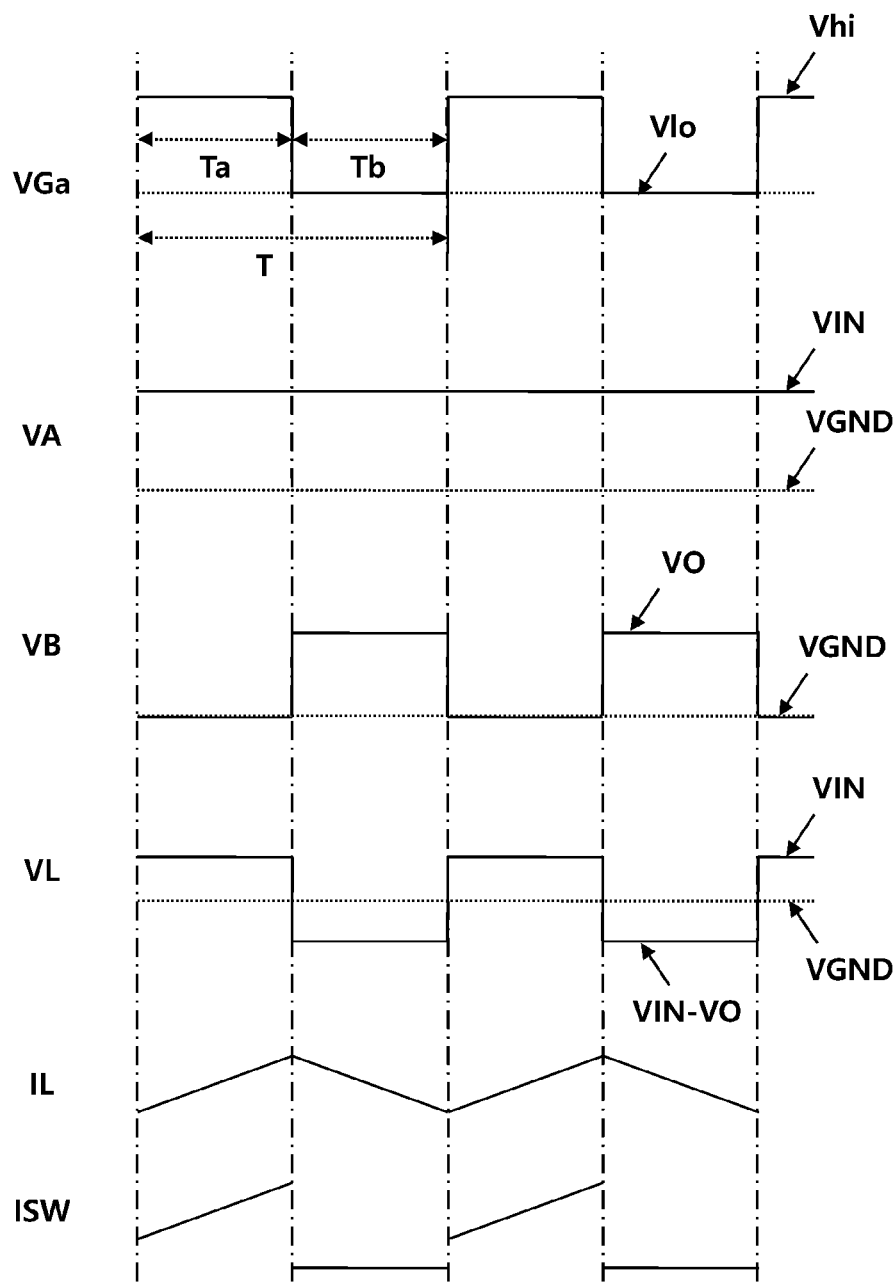
FIG. 2 illustrates waveform diagrams of a main signal, voltage, and current illustrated in FIG. 1.

FIG. 2 illustrates waveform diagrams of a main signal, voltage, and current illustrated in FIG. 1.

Referring to FIG. 1 and FIG. 2, the power management integrated circuit 100 in a power stage driving mode may form a first gate controlling signal VGa at a high voltage level Vhi in a first control interval Ta of a control period T, and may form the first gate controlling signal VGa at a low voltage level Vlo in a second control interval Tb in the control period T.

An inductor one-side voltage VA may be maintained at the input voltage VIN throughout the control period T, but an inductor other-side voltage VB may be the ground voltage VGND in the first control interval Ta according to on/off of the first switch SW, and may be the output voltage VO in the second control interval Tb.

The voltage VL formed in the inductor according to a difference between the inductor one-side voltage VA and the inductor other-side voltage VB may be the input voltage VIN in the first control interval Ta, and may be voltage VIN–VO corresponding to the difference between the input voltage VIN and the output voltage VO in the second control interval Tb.

When the inductor voltage VL has a positive value, the inductor current IL increases, and when the inductor voltage VL has a negative value, the inductor current IL decreases. Referring to FIG. 2, when the inductor voltage VL has a positive value in the first control interval Ta, the inductor current IL increases, and when the inductor voltage VL has a negative value in the second control interval Tb, the inductor current IL decreases.

The first switch current ISW may have the same value as that of the inductor current IL in the first control interval Ta, and may have a value of 0 in the second control interval Tb.

A manufacturer for the power management integrated circuit 100 may determine whether the power management integrated circuit 100 is good or defective by checking a part of main waveforms illustrated in FIG. 2 or checking the magnitude of output voltage VO. Conventionally, the manufacturer connects the power stage 10 to the power management integrated circuit 100, and checks a part of the main waveforms illustrated in FIG. 2 or checks the output voltage VO, so as to determine whether the power management integrated circuit 100 is good. However, the power management integrated circuit 100 according to an embodiment of the present specification may further include a test element, and may be tested in a state where the test element is not connected to the described power stage 10 and the like.

Figure 3:
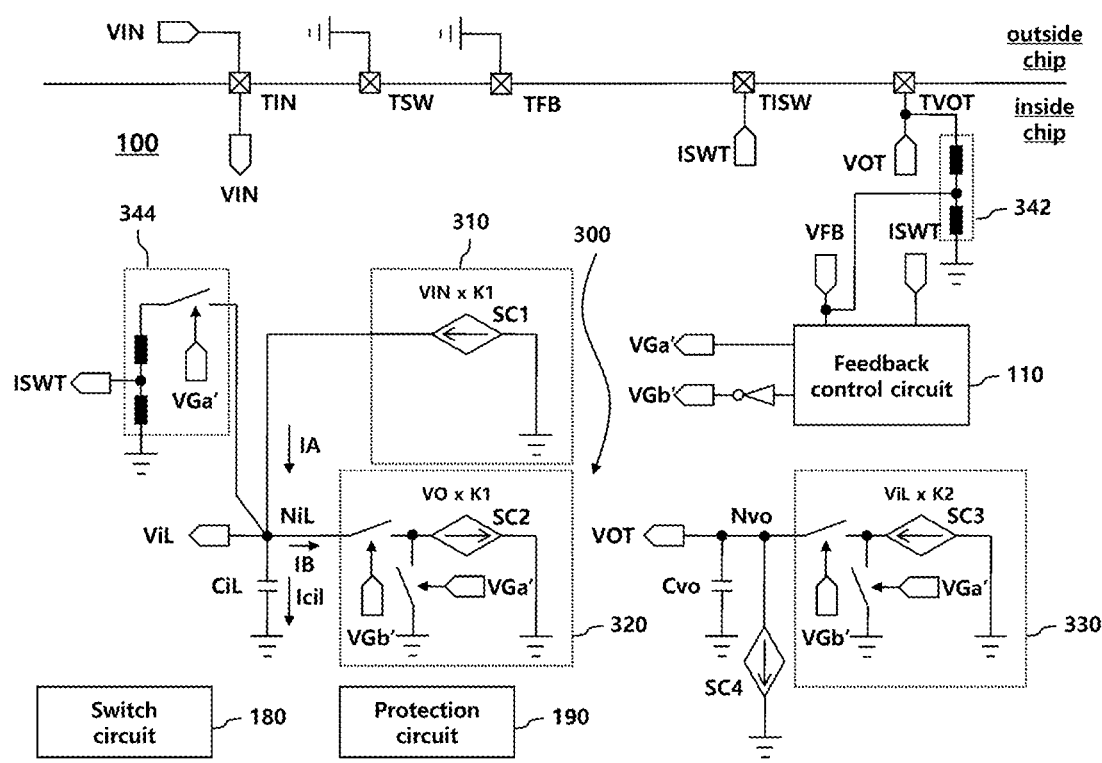
FIG. 3 is a first exemplary configuration diagram in which a test element is further added to the power management integrated circuit according to an embodiment.

FIG. 3 is a first exemplary configuration diagram in which a test element is further added to the power management integrated circuit according to an embodiment.

Referring to FIG. 3, the power management integrated circuit 100 may include a feedback control circuit 110, a switch circuit 180, a protection circuit 190, an input voltage terminal TIN, a switch node terminal TSW, and a feedback terminal TFB, and may further include, as test elements, a simulation voltage formation unit 300, a first simulation voltage output terminal TVOT and a second simulation voltage output terminal TISW.

In a test mode, the switch node terminal TSW and the feedback terminal TFB may not be used due to connection to the ground from the outside of a chip. In addition, the switch circuit 180 may not be used in the test mode either. The protection circuit 190 may operate both in the power stage driving mode and the test mode.

The simulation voltage formation unit 300 may simulate the inductor by using a capacitor and may simulate the inductor voltage by using a current source, so as to test internal elements without attaching a test device, such as the power stage, to the outside of the chip. As the power stage including the inductor and at least one switch generate an output voltage according to the gate controlling signals of the feedback control circuit 110, the simulation voltage formation unit 300 may generate a first simulation voltage VOT corresponding to the output voltage according to the simulation controlling signals VGa' and VGb'. Here, the gate controlling signals may be practically identical to the simulation controlling signals.

The simulation voltage formation unit 300 may include a first capacitor CiL and a second capacitor Cvo. The first capacitor CiL may simulate the inductor of the power stage, and the second capacitor Cvo may simulate an output capacitor of the power stage.

The inductor of the power stage operates such that the inductor current increases when the inductor voltage is formed as a positive voltage, and the inductor current decreases when the inductor voltage is formed as a negative voltage. Further, the first capacitor CiL may operate such that a first capacitor voltage ViL increases when a first capacitor current Icil is formed as a positive current (charging current), and the first capacitor voltage ViL decreases when the first capacitor current Icil is formed as a negative current (discharging current).

The simulation voltage formation unit 300 may include multiple current sources SC1-SC4.

A first current source circuit 310 including a first current source SC1 may form a one-side current IA that simulates the one-side voltage of the inductor. The first current source SC1 may supply a first current obtained by scaling down an input voltage by a first ratio K1 to one-side node NiL of the first capacitor.

A second current source circuit 320 including a second current source SC2 may form other-side current IB that simulates the other-side voltage of the inductor. The second current source SC2 may supply a second current obtained by scaling down an output voltage by the first ratio K1, wherein the second current source circuit 320 may supply the second current to the one-side node NiL of the first capacitor in the second control interval according to the second simulation controlling signal VGb', and may not supply the second current to the first capacitor CiL in the first control interval according to the first simulation controlling signal VGa'. The one-side current IA and the other-side current IB may have different magnitudes of inductor one-side voltages and inductor other-side voltages, and may have substantially the same waveform.

The first current and the second current output from the first current source SC1 and the second current source SC2 are currents obtained by scaling down the input voltage and the output voltage by the first ratio K1, and energy stored in the first capacitor CiL by this structure may be smaller than energy stored in the inductor. For example, if the first ratio K1 is 1/100, the energy stored in the first capacitor CiL may be basically as small as 1/10000 of the energy stored in the inductor when capacitance of the first capacitor CiL is not considered.

The voltage ViL of the first capacitor may simulate an inductor current. A second simulation voltage ISWT that simulates a first switch current with the voltage ViL of the first capacitor may be formed. A second auxiliary circuit 344 may form the second simulation voltage ISWT by outputting the voltage ViL of the first capacitor in accordance with the first control interval in which the first switch is turned on, wherein the second simulation voltage ISWT may be formed by adjusting the magnitude of the voltage ViL of the first capacitor.

The voltage ViL of the first capacitor may simulate the inductor current, and in order to simulate transferring of the inductor current to the output capacitor, the voltage ViL of the first capacitor may be converted into current by a third current source circuit 330 and then supplied to one-side node Nvo of the second capacitor. The third current source circuit 330 may supply, through a third current source SC3, a third current obtained by adjusting the magnitude of the voltage ViL of the first capacitor by a second ratio K2 to the one-side node Nvo of the second capacitor according to the simulation controlling signals VGa' and VGb'. The third current source circuit 330 may include a third current source SC3 that generates a third current, and the third current source circuit 330 may supply the third current to the one-side node Nvo of the second capacitor in the second control interval, without supplying the third current in the first control interval.

A fourth current source SC4 may also be connected to the one-side node Nvo of the second capacitor. The fourth current source SC4 is to simulate a load, and when the load has a predetermined clock, the simulation voltage formation unit 300 may control the fourth current source SC4 to receive the fourth current from the one-side node Nvo of the second capacitor according to the predetermined clock.

A first simulation voltage VOT may be formed in the one-side node of the second capacitor, and the first simulation voltage VOT may correspond to the output voltage of the power stage. According to an embodiment, the magnitude of the first simulation voltage VOT may be different from the magnitude of the output voltage, but the first simulation voltage VOT may have the same waveform as that of the output voltage.

A first auxiliary circuit 342 may adjust the magnitude of the first simulation voltage VOT to form a feedback voltage VFB, and may input the feedback voltage VFB to the feedback control circuit 110. Further, the feedback control circuit 110 may generate simulation controlling signals VGa' and VGb' according to the feedback voltage VFB so as to supply the generated simulation controlling signals to the simulation voltage formation unit 300.

The first simulation voltage VOT may be output to the outside through the first simulation voltage output terminal TVOT. A manufacturer may input an input voltage VIN to the power management integrated circuit 100, and may observe the first simulation voltage VOT output to the first simulation voltage output terminal TVOT, so as to determine whether the feedback control circuit 110 of the power management integrated circuit 100 normally operates.

The second simulation voltage ISWT may be output to the outside of the chip through the second simulation voltage output terminal TISW. A manufacturer may input the input voltage VIN to the power management integrated circuit 100, and may observe the second simulation voltage ISWT output to the second simulation voltage output terminal TISW, so as to determine whether the feedback control circuit 110 of the power management integrated circuit 100 normally operates.

Figure 4:
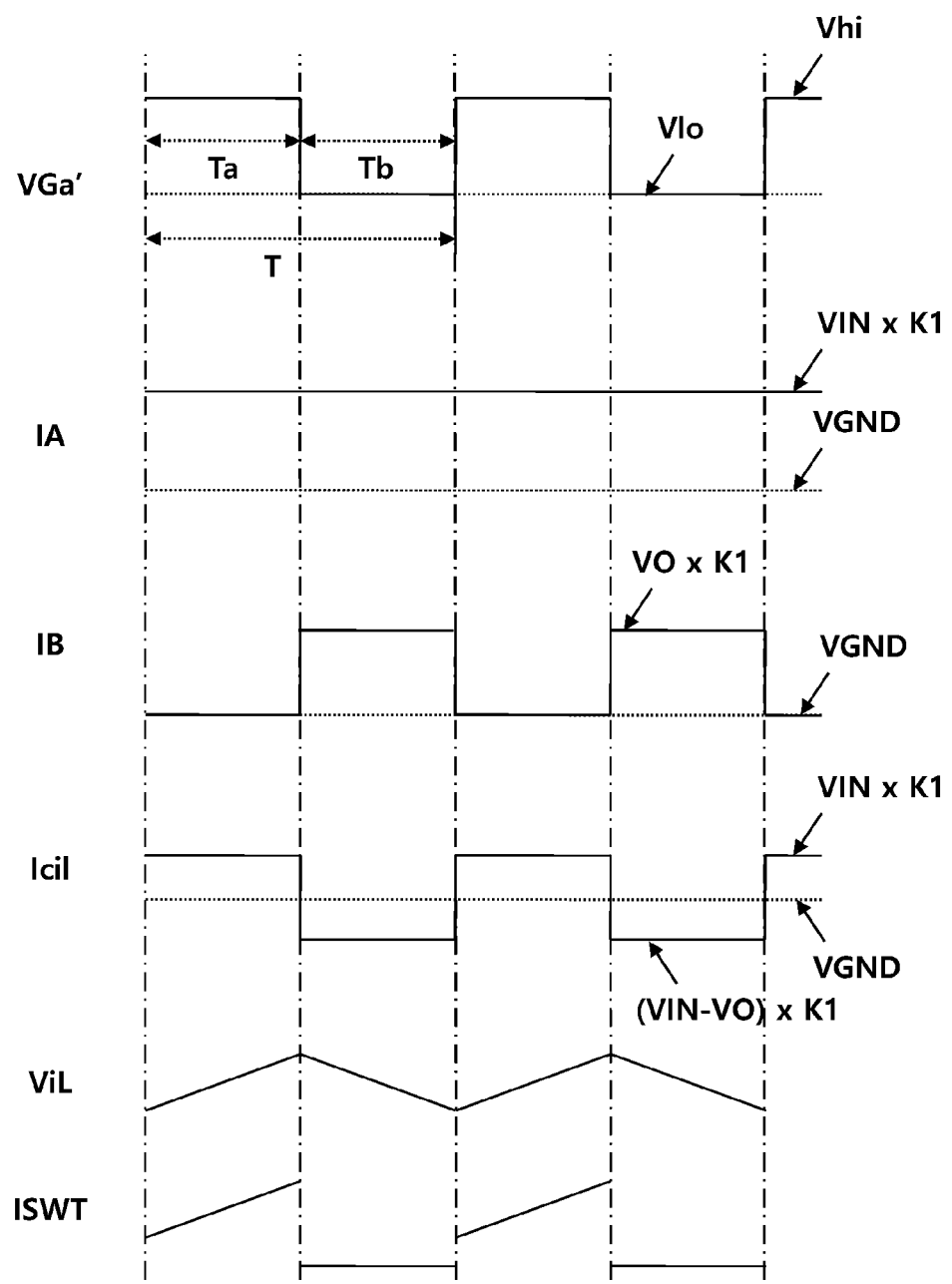
FIG. 4 illustrates waveform diagrams of a main signal, voltage, and current illustrated in FIG. 3.

FIG. 4 illustrates waveform diagrams of a main signal, voltage, and current illustrated in FIG. 3.

Referring to FIG. 3 and FIG. 4, the power management integrated circuit 100 in a test mode may form a first simulation controlling signal VGa' at a high voltage level Vhi in a first control interval Ta of a control period T, and may form the first simulation controlling signal VGa' at a low voltage level Vlo in a second control interval Tb in the control period T.

Throughout the control period T, the one-side current IA for the first capacitor may be maintained at a first current (VIN×K1) obtained by scaling down the input voltage by the first ratio, but the other-side current IB for the first capacitor may be the ground voltage VGND in the first control interval Ta, and may be a second current (VO×K1) obtained by scaling down the output voltage by the first ratio in the second control interval Tb.

According to a difference between the one-side current IA and the other-side current IB, current Icil formed in the first capacitor may be a first current VIN×K1 in the first control interval Ta, and may be current (VIN−VO)×K1 obtained by scaling down, by the first ratio, a difference between the input voltage VIN and the output voltage VO in the second control interval Tb.

If the first capacitor current Icil has a positive value, the first capacitor voltage ViL increases, and if the first capacitor current Icil has a negative value, the first capacitor voltage ViL decreases. Referring to FIG. 4, the first capacitor voltage ViL increases when the first capacitor current Icil has a positive value in the first control interval Ta, and the first capacitor voltage ViL decreases when the first capacitor current Icil has a negative value in the second control interval Tb.

In comparison of FIG. 2 and FIG. 4, it may be identified that the simulation voltage formation unit of the power management integrated circuit simulates the inductor current IL with the first capacitor voltage ViL, and simulates the first switch current ISW with the second simulation voltage ISWT.

In a first example described with reference to FIG. 3 and FIG. 4, it has been described that the first simulation voltage VOT and the second simulation voltage ISWT are output through the individually formed first simulation voltage output terminal TVOT and second simulation voltage output terminal TISW. However, the first simulation voltage VOT and the second simulation voltage ISWT may be output through an existing terminal used in the power stage driving mode.

Figure 5:
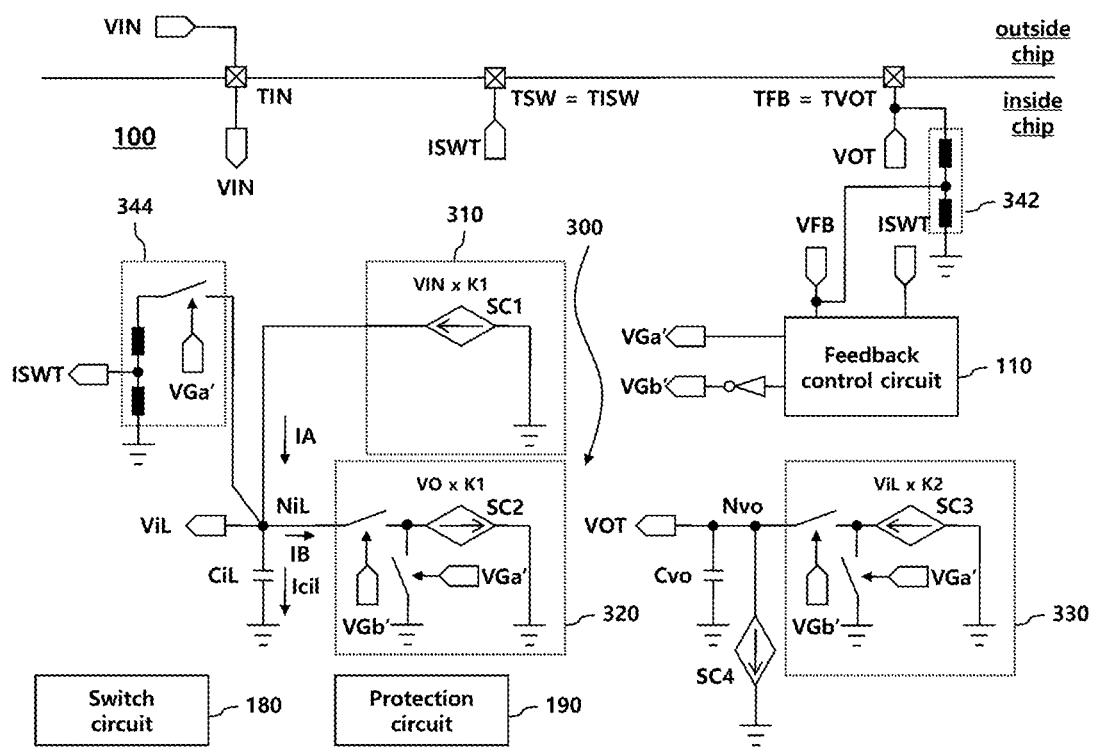
FIG. 5 is a second exemplary configuration diagram in which a test element is further added to the power management integrated circuit according to an embodiment.

FIG. 5 is a second exemplary configuration diagram in which a test element is further added to the power management integrated circuit according to an embodiment.

Referring to FIG. 5, the first simulation voltage VOT is output to the feedback terminal TFB, and the second simulation voltage ISWT is output to the switch node terminal TSW.

The feedback terminal TFB may be used to receive an input of a feedback voltage in the power stage driving mode, and may be used as a terminal to which the first simulation voltage VOT is output in the test mode.

Further, a sensing value of the inductor current may be input to the switch node terminal TSW in the power stage driving mode, and the second simulation voltage ISWT may be output to the switch node terminal TSW in the test mode. The sensing value of the inductor current may be input to the switch node terminal TSW only in a partial interval of the control period. For example, when current of the first switch is input to the switch node terminal TSW, it may be understood that the sensing value of the inductor current is input to the switch node terminal TSW only in the first control interval.

With reference to FIG. 3, it has been described that the second simulation voltage ISWT may be formed with the voltage of the first capacitor, which corresponds to the first control interval, but the second simulation voltage ISWT may be formed through the voltage of the first capacitor, which corresponds to all the control period.

As described with reference to FIG. 5, embodiments of the present specification may have the same terminals as those of the existing terminals and may operate in the power stage driving mode and the test mode.

Figure 6:
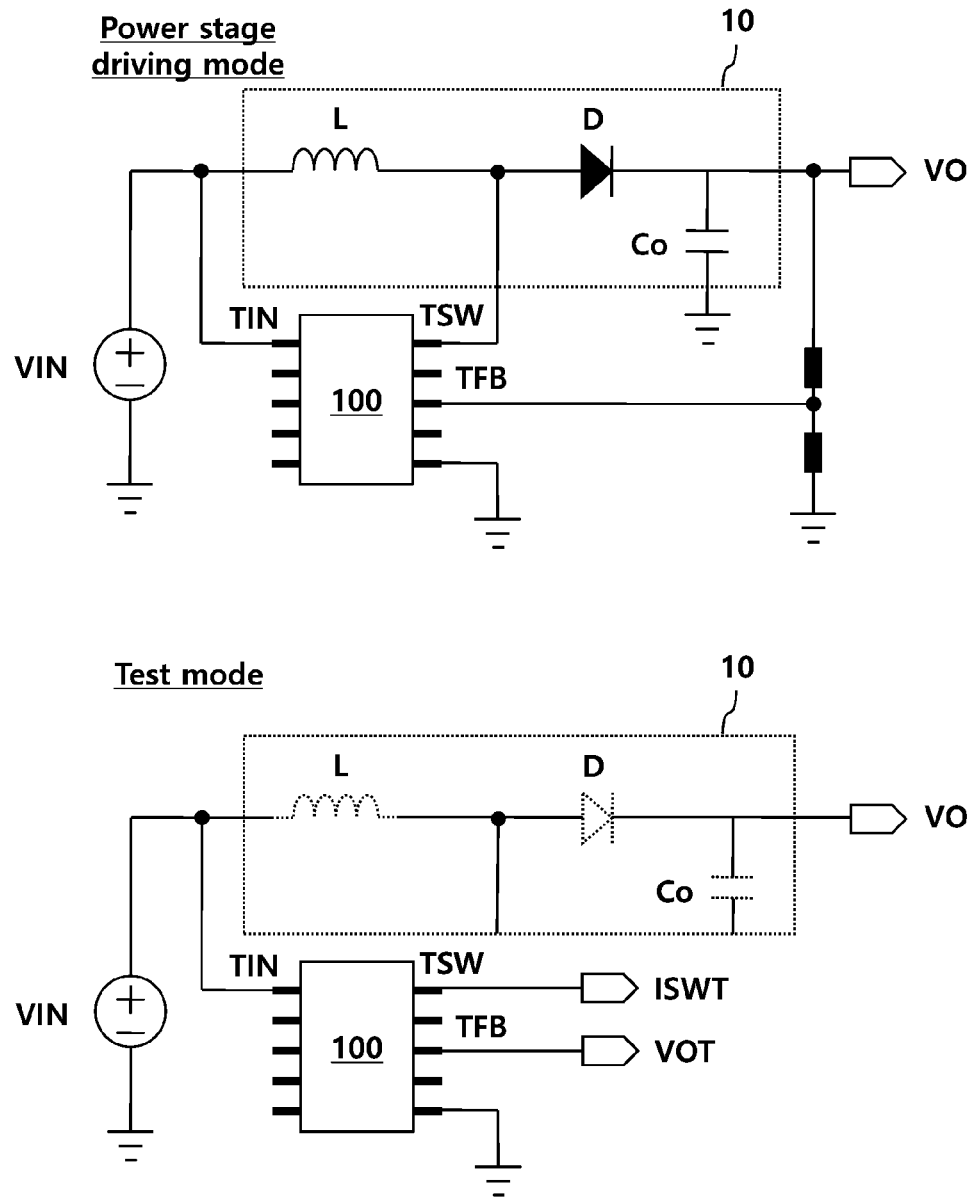
FIG. 6 is a diagram showing implementations of the power management integrated circuit in a power stage driving mode and a test mode according to an embodiment.

FIG. 6 is a diagram showing implementations of the power management integrated circuit in a power stage driving mode and a test mode according to an embodiment.

Referring to implementation illustrated in the upper side of FIG. 6, in the power stage driving mode, the input voltage terminal TIN of the power management integrated circuit 100 may be connected to the input voltage VIN, the switch node terminal TSW may be connected to a node connected to the inductor L and the diode D, and the feedback terminal TFB may be connected to a node in which the output voltage VO is branched by a feedback resistor. According to this connection, the power management integrated circuit 100 may control the power stage 10 to convert the input voltage VIN to form the output voltage VO according to a set value.

Referring to implementation illustrated in the lower side of FIG. 6, in the test mode, the input voltage terminal TIN of the power management integrated circuit 100 may be connected to the input voltage VIN. The switch node terminal TSW and the feedback terminal TFB may not be connected to the power stage 10.

Because the power management integrated circuit 100 includes elements that simulate the power stage 10, the first simulation voltage VOT corresponding to the output voltage VO and the second simulation voltage ISWT corresponding to the inductor current may be formed by converting the input voltage VIN, and may be output through each of the feedback terminal TFB and the switch node terminal TSW.

A manufacturer may determine whether the power management integrated circuit 100 is good, by inserting the input voltage VIN into the power management integrated circuit 100 and monitoring the feedback terminal TFB and/or the switch node terminal TSW, in the test mode.

Multiple power management integrated circuits 100 may be concurrently tested.

Figure 7:
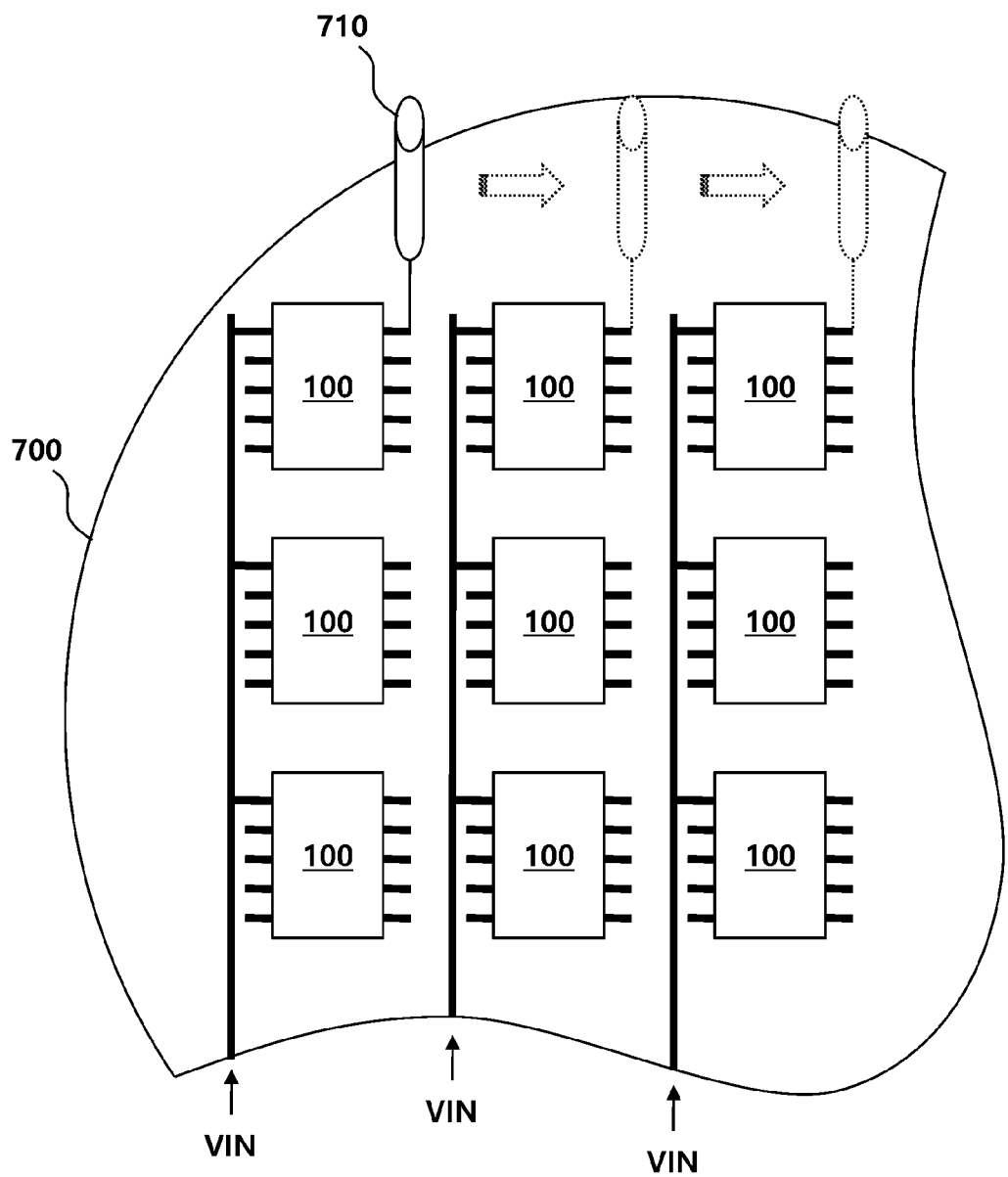
FIG. 7 is a diagram showing testing of the power management integrated circuit in a wafer state according to an embodiment.

FIG. 7 is a diagram showing testing of the power management integrated circuit in a wafer state according to an embodiment.

Referring to FIG. 7, the power management integrated circuit 100 may be tested in a wafer 700 state. When input voltage VIN is inserted to multiple power management integrated circuits 100 formed in the wafer 700, voltage corresponding to voltage formed when the power management integrated circuits 100 are normally controlled may be output to one terminal thereof, and a manufacturer may determine whether the power management integrated circuits 100 normally operate, by monitoring the one terminal through a tester 710.

In the embodiments above, examples of a power management integrated circuit that controls a step-up converter have been described. However, the present disclosure is not limited thereto, and all technical ideas of the present disclosure may be applied to a power management integrated circuit that controls a power stage including an inductor. Hereinafter, another embodiment of the present disclosure will be described through a power management integrated circuit that controls a step-down converter.

Figure 8:
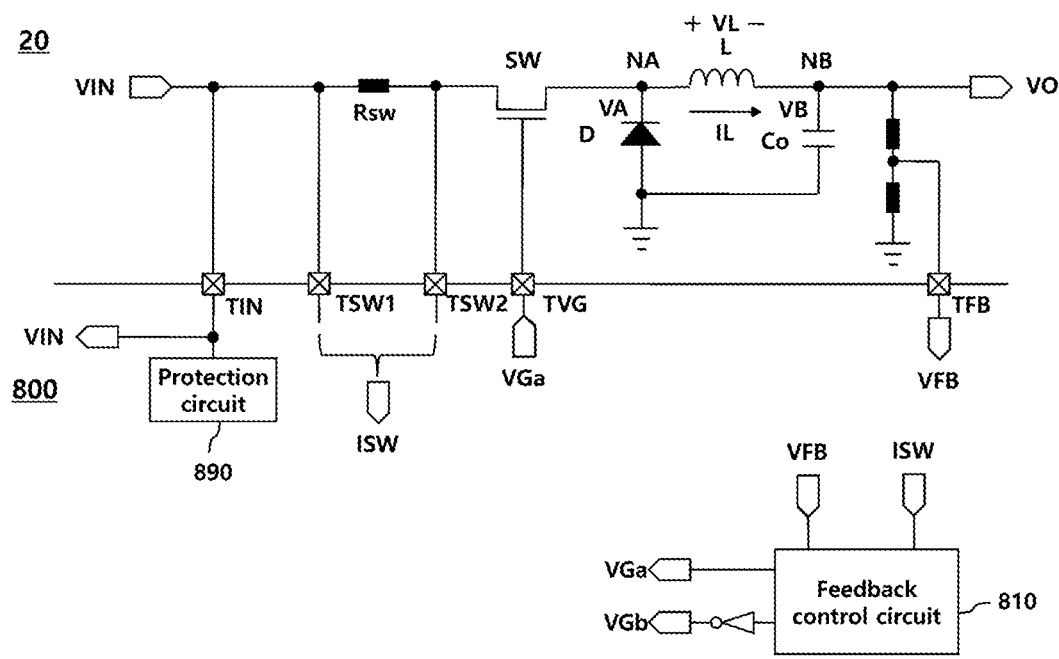
FIG. 8 is a diagram showing a state in which a power management integrated circuit and a power stage are connected according to an embodiment.

FIG. 8 is a diagram showing a state in which a power management integrated circuit and a power stage are connected according to an embodiment.

Referring to FIG. 8, a power stage 20 may include an inductor L, a first switch SW, a sensing resistor Rsw, a diode D, an output capacitor Co, and the like. The power stage 20 may include the inductor L, and may form an output voltage VO by a method of outputting, to the output capacitor Co, an inductor current IL controlled according to an inductor voltage VL formed in the inductor L.

In the power stage 20 of a step-down converter type, the first switch SW and the diode D are connected to one-side node NA of the inductor, and the output voltage VO may be connected to the other-side node NB. A cathode electrode of the diode D may be connected to the one-side node NA of the inductor and an anode electrode of the diode D may be connected to the ground, so that, if a one-side node voltage (inductor one-side voltage VA) of the inductor is higher than the ground voltage, the first switch SW is turned off, and conduction may be achieved when the first switch SW is turned off.

The input voltage VIN may be supplied to a drain electrode of the first switch SW, and a source electrode of the first switch SW may be connected to the one-side node NA. A sensing resistor Rsw may be disposed between the first switch SW and the input voltage VIN. The first switch SW and the sensing resistor Rsw may be included in the power stage 20, and may be included in the power management integrated circuit 800.

The power management integrated circuit 800 may include a feedback control circuit 810, a protection circuit 890, and the like, and may further include an input vt terminal TIN, a first control signal terminal TVG, a switch node terminal TSW1 and TSW2, a feedback terminal TFB, and the like. Here, the first switch node terminal TSW1 may be formed independently of the input voltage terminal TIN, and may be the same terminal as the input voltage terminal TIN.

The power management integrated circuit 800 may control the first switch SW so that the output voltage VO of the power stage 20 conforms to a set value. For this control, the power management integrated circuit 800 may receive the output voltage VO or a feedback voltage VFB corresponding to the output voltage VO. As an example in FIG. 8, the power management integrated circuit 800 receives, through the feedback terminal TFB, a feedback voltage VFB in which the output voltage VO is reduced at a predetermined ratio by a feedback branch circuit. As another example, the power management integrated circuit 800 may directly receive the output voltage VO through an output voltage terminal (not illustrated).

The feedback control circuit 810 may compare a feedback voltage VFB with a set value, and may generate a first gate controlling signal VGa for the first switch SW such that the feedback voltage VFB coincides with the set value, and may output the generated first gate controlling signal VGa. For example, if the feedback voltage VFB is higher than the set value, the feedback control circuit 810 may generate the first gate controlling signal VGa so that a ratio of the first control interval, in which the first switch SW is turned on, decreases, and may generate the first gate controlling signal VGa so that a ratio of the first control interval increases if the feedback voltage VFB is lower than the set value. The first gate controlling signal VGa may be output to a gate electrode of the first switch SW through the first control signal terminal TVG.

A second switch (not illustrated) which can be turned on/off may be used instead of the diode D, and the second switch (not illustrated) may be turned on/off as opposed to the first switch SW. For control of the second switch (not illustrated), the feedback control circuit 810 may generate a second gate controlling signal VGb. The second gate controlling signal VGb may have a waveform that is an inverted waveform of the first gate controlling signal VGa.

The sensing voltage ISW of the sensing resistor Rsw may be input through the switch node terminals TSW1 and TSW2 so as to be transferred to the feedback control circuit 810.

The sensing voltage ISW is a value corresponding to current flowing through the first switch SW, and may correspond to the inductor current IL in the first control interval. The feedback control circuit 810 may identify, through the sensing voltage ISW, the inductor current IL or the current flowing through the first switch SW, and may compare a current setting value with the inductor current IL or the current flowing through the first switch SW, so as to control the first switch SW. This control may be referred to as a current control and, according to the current control, the feedback control circuit 810 may control the inductor current IL or the output current to have a predetermined value, and may perform protection so as to prevent the inductor current IL or the current flowing through the first switch SW from exceeding the predetermined value.

The protection circuit 890 may perform protection to prevent the power management integrated circuit 800 from being damaged by external influences. For example, the protection circuit 890 may perform protection to prevent an input voltage VIN identified through the input voltage terminal TIN from exceeding a predetermined value, and may block introduction of electro-static discharge (ESD) through the input voltage terminal TIN.

By using such configurations in a power stage driving mode, the power management integrated circuit 800 may control the power stage 20 including the inductor L to output voltage according to a set value. Particularly, the feedback control circuit 810 may generate gate controlling signals VGa and VGb for at least one switch SW so that the inductor voltage VL formed in the inductor L is controlled according to the feedback voltage VFB corresponding to the output voltage VO of the power stage 20.

Figure 9:
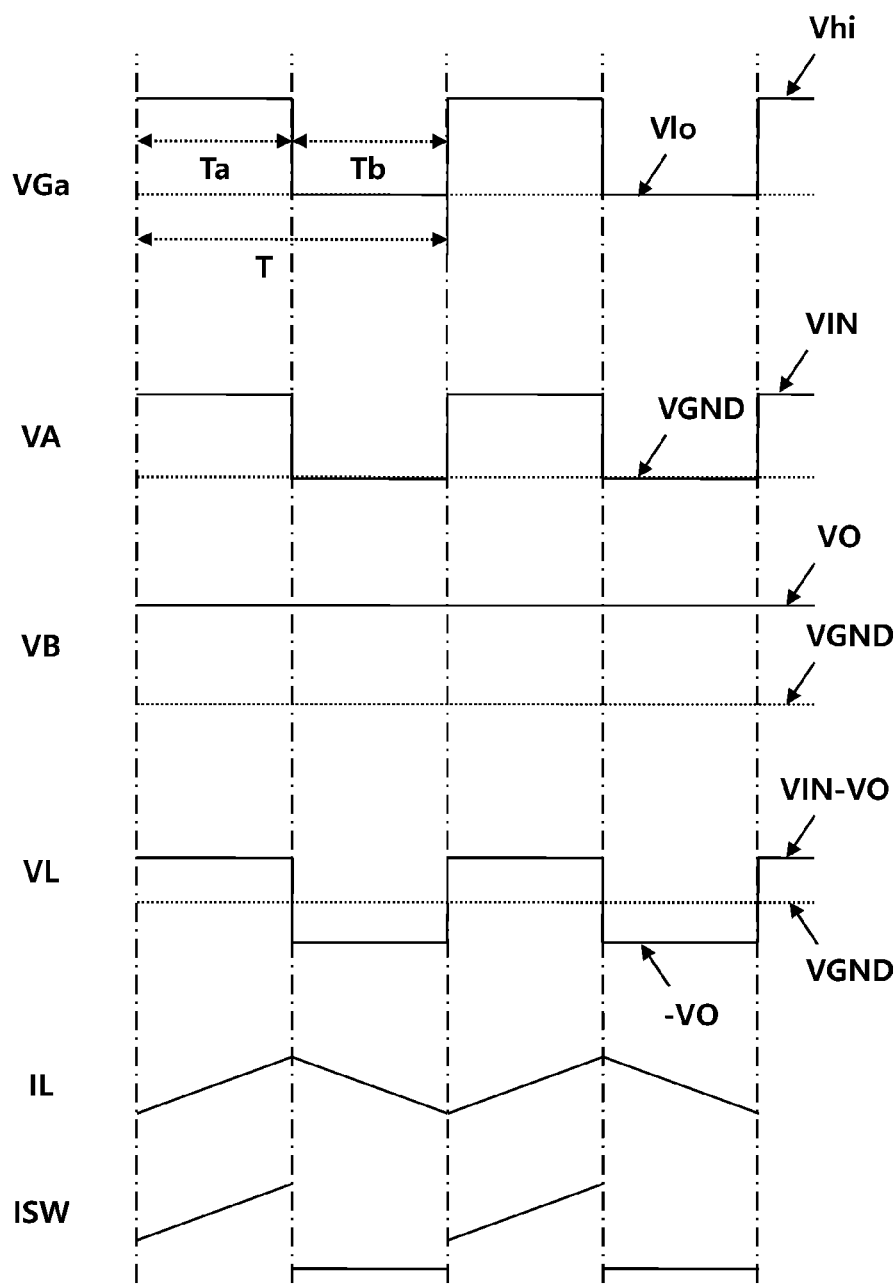
FIG. 9 illustrates waveform diagrams of a main signal, voltage, and current illustrated in FIG. 8.

FIG. 9 illustrates waveform diagrams of a main signal, voltage, and current illustrated in FIG. 8.

Referring to FIG. 8 and FIG. 9, the power management integrated circuit 800 in a power stage driving mode may generate a first gate controlling signal VGa at a high voltage level Vhi in a first control interval Ta of a control period T, and may generate the first gate controlling signal VGa at a low voltage level Vlo in a second control interval Tb in the control period T.

An inductor other-side voltage VB may be maintained at the output voltage VO throughout the control period T, but an inductor one-side voltage VA may be the input voltage VIN in the first control interval Ta according to on/off of the first switch SW, and may be the ground voltage VGND in the second control interval Tb.

The voltage VL formed in the inductor according to a difference between the inductor one-side voltage VA and the inductor other-side voltage VB may be voltage VIN−VO corresponding to a difference between the input voltage VIN and the output voltage VO in the first control interval Ta, and may be voltage −VO corresponding to a difference between the ground voltage and the output voltage in the second control interval Tb.

When the inductor voltage VL has a positive value, the inductor current IL increases, and when the inductor voltage VL has a negative value, the inductor current IL decreases. Referring to FIG. 9, when the inductor voltage VL has a positive value in the first control interval Ta, the inductor current IL increases, and when the inductor voltage VL has a negative value in the second control interval Tb, the inductor current IL decreases.

The first switch current ISW may have the same value as that of the inductor current IL in the first control interval Ta, and may have a value of 0 in the second control interval Tb.

A manufacturer for the power management integrated circuit 800 may determine whether the power management integrated circuit 800 is good or defective by checking a part of main waveforms illustrated in FIG. 9 or checking the magnitude of output voltage VO. Conventionally, the manufacturer connects the power stage 20 to the power management integrated circuit 800, and checks a part of the main waveforms illustrated in FIG. 9 or checks the output voltage VO, so as to determine whether the power management integrated circuit 800 is good. However, the power management integrated circuit 800 according to an embodiment of the present specification may further include a test element, and may be tested in a state where the test element is not connected to the described power stage 20 and the like.

Figure 10:
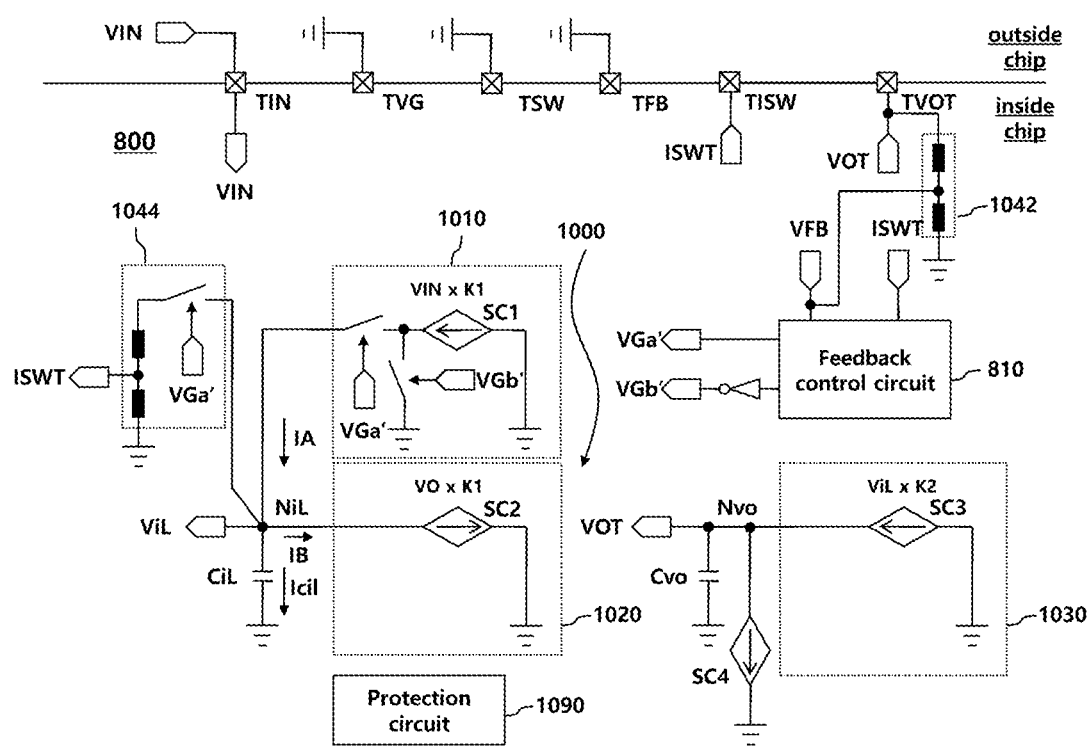
FIG. 10 is a first exemplary configuration diagram in which a test element is further added to the power management integrated circuit according to an embodiment.

FIG. 10 is a first exemplary configuration diagram in which a test element is further added to the power management integrated circuit according to an embodiment.

Referring to FIG. 10, the power management integrated circuit 800 may include a feedback control circuit 810, a protection circuit 1090, an input voltage terminal TIN, a first control signal terminal TVG, a switch node terminal TSW, and a feedback terminal TFB, and may further include, as test elements, a first simulation voltage formation unit 1000, a first simulation voltage output terminal TVOT, and a second simulation voltage output terminal TISW. The switch node terminal TSW may correspond to the first switch node terminal (TSW1 in FIG. 8) and the second switch node terminal (TSW2 in FIG. 8) in FIG. 8, and may correspond to one terminal among the first switch node terminal (TSW1 in FIG. 8) and the second switch node terminal (TSW2 in FIG. 8) in FIG. 8.

In the test mode, the switch node terminal TSW, the first control signal terminal TVG, and the feedback terminal TFB may not be used due to connection to the ground from the outside of a chip. The protection circuit 1090 may operate both in the power stage driving mode and the test mode.

The simulation voltage formation unit 1000 may simulate the inductor by using a capacitor, so as to test internal elements without attaching a test device, such as the power stage, to the outside of the chip. As the power stage including the inductor and at least one switch form an output voltage according to the gate controlling signals of the feedback control circuit 810, the simulation voltage formation unit 1000 may form a first simulation voltage VOT corresponding to the output voltage according to the simulation controlling signals VGa' and VGb'.

The simulation voltage formation unit 1000 may include a first capacitor CiL and a second capacitor Cvo. The first capacitor CiL may simulate the inductor of the power stage, and the second capacitor Cvo may simulate an output capacitor of the power stage.

The inductor of the power stage operates such that the inductor current increases when the inductor voltage is formed as a positive voltage, and the inductor current decreases when the inductor voltage is formed as a negative voltage. Further, the first capacitor CiL may operate such that a first capacitor voltage ViL increases when a first capacitor current Icil is formed as a positive current (charging current), and the first capacitor voltage ViL decreases when the first capacitor current Icil is formed as a negative current (discharging current).

The simulation voltage formation unit 1000 may include multiple current sources SC1-SC4.

A first current source circuit 1010 including a first current source SC1 may generate a one-side current IA that simulates the one-side voltage of the inductor. The first current source SC1 may supply a first current obtained by scaling down an input voltage by the first ratio K1, wherein the first current source circuit 1010 may supply the first current to the one-side node NiL of the first capacitor in the first control interval according to the first simulation controlling signal VGa', and may not supply the first current to the first capacitor CiL in the second control interval according to the second simulation controlling signal VGb'.

A second current source circuit 1020 including a second current source SC2 may generate other-side current IB that simulates the other-side voltage of the inductor. The second current source SC2 may supply a second current obtained by scaling down an output voltage by a first ratio K1 to a one-side node NiL of the first capacitor. The one-side current IA and the other-side current IB may have different magnitudes of inductor one-side voltages and inductor other-side voltages, and may have substantially the same waveform.

The first current and the second current output from the first current source SC1 and the second current source SC2 are currents obtained by scaling down the input voltage and the output voltage by the first ratio K1, and energy stored in the first capacitor CiL by this structure may be smaller than energy stored in the inductor. For example, if the first ratio K1 is 1/100, the energy stored in the first capacitor CiL may be basically as small as 1/10000 of the energy stored in the inductor when capacitance of the first capacitor CiL is not considered.

The voltage ViL of the first capacitor may simulate an inductor current. A second simulation voltage ISWT that simulates a first switch current with the voltage ViL of the first capacitor may be formed. A second auxiliary circuit 1044 may form the second simulation voltage ISWT by outputting the voltage ViL of the first capacitor in accordance with the first control interval in which the first switch is turned on, wherein the second simulation voltage ISWT may be formed by adjusting the magnitude of the voltage ViL of the first capacitor.

The voltage ViL of the first capacitor may simulate the inductor current, and in order to simulate transferring of the inductor current to the output capacitor, the voltage ViL of the first capacitor may be converted into current by a third current source circuit 1030 and then supplied to one-side node Nvo of the second capacitor. The third current source circuit 1030 may supply a third current obtained by adjusting the magnitude of the voltage ViL of the first capacitor by a second ratio K2 to the one-side node Nvo of the second capacitor.

A fourth current source SC4 may also be connected to the one-side node Nvo of the second capacitor. The fourth current source SC4 is to simulate a load, and when the load has a predetermined clock, the simulation voltage formation unit 1000 may control the fourth current source SC4 to receive the fourth current from the one-side node Nvo of the second capacitor according to the predetermined clock.

A first simulation voltage VOT may be formed in the one-side node of the second capacitor, and the first simulation voltage VOT may correspond to the output voltage of the power stage. According to an embodiment, the magnitude of the first simulation voltage VOT may be different from the magnitude of the output voltage, but the first simulation voltage VOT may have the same waveform as that of the output voltage.

A first auxiliary circuit 1042 may adjust the magnitude of the first simulation voltage VOT to form a feedback voltage VFB, and may input the feedback voltage VFB to the feedback control circuit 810. Further, the feedback control circuit 810 may generate simulation controlling signals VGa' and VGb' according to the feedback voltage VFB so as to supply the generated simulation controlling signals to the simulation voltage formation unit 1000.

The first simulation voltage VOT may be output to the outside through the first simulation voltage output terminal TVOT. A manufacturer may input an input voltage VIN to the power management integrated circuit 800, and may observe the first simulation voltage VOT output to the first simulation voltage output terminal TVOT, so as to determine whether the feedback control circuit 810 of the power management integrated circuit 800 normally operates.

The second simulation voltage ISWT may be output to the outside of the chip through the second simulation voltage output terminal TISW. A manufacturer may input the input voltage VIN to the power management integrated circuit 800, and may observe the second simulation voltage ISWT output to the second simulation voltage output terminal TISW, so as to determine whether the feedback control circuit 810 of the power management integrated circuit 800 normally operates.

Figure 11:
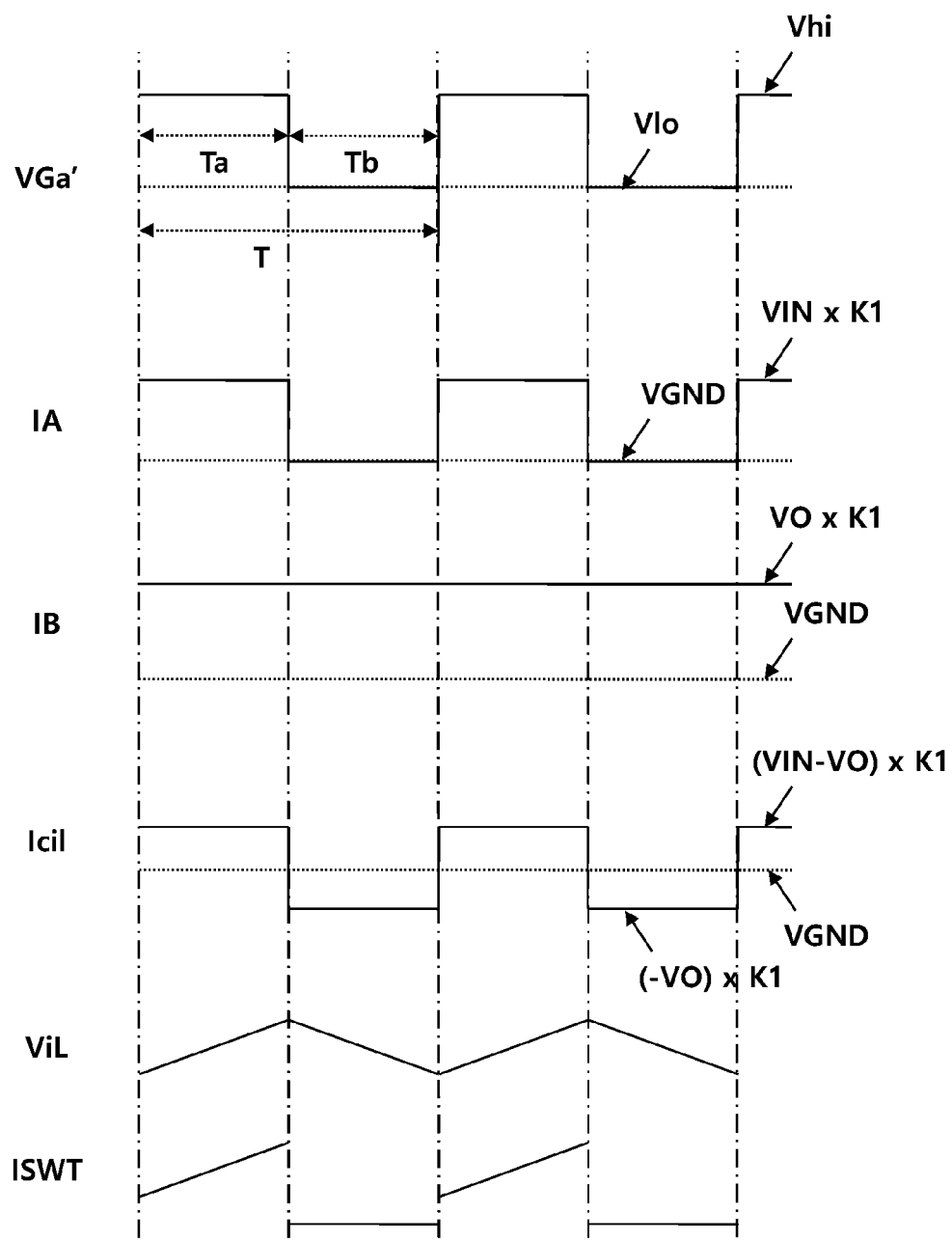
FIG. 11 illustrates waveform diagrams of a main signal, voltage, and current illustrated in FIG. 10.

FIG. 11 illustrates waveform diagrams of a main signal, voltage, and current illustrated in FIG. 10.

Referring to FIG. 10 and FIG. 11, the power management integrated circuit 800 in a test mode may form a first simulation controlling signal VGa' at a high voltage level Vhi in a first control interval Ta of a control period T, and may form the first simulation controlling signal VGa' at a low voltage level Vlo in a second control interval Tb in the control period T.

Throughout the control period T, other-side current IB for the first capacitor may be maintained at a second current VO×K1 obtained by scaling-down the output voltage by a first ratio, but one-side current IA for the first capacitor may be a first current VIN×K1 obtained by scaling down the input voltage by the first ratio in the first control interval Ta, and may be a ground voltage 0 A in the second control interval Tb.

According to a difference between the one-side current IA and the other-side current IB, current Icil formed in the first capacitor may be a first current (VIN−VO)×K1 obtained by scaling down, by the first ratio, the voltage VIN−VO corresponding to a difference between the input voltage VIN and the output voltage VO in the first control interval Ta, and may be current (−VO)×K1 obtained by scaling down, by the first ratio, voltage corresponding to a difference between the ground voltage and the output voltage in the second control interval Tb.

If the first capacitor current Icil has a positive value, the first capacitor voltage ViL increases, and if the first capacitor current Icil has a negative value, the first capacitor voltage ViL decreases. Referring to FIG. 11, the first capacitor voltage ViL increases when the first capacitor current Icil has a positive value in the first control interval Ta, and the first capacitor voltage ViL decreases when the first capacitor current Icil has a negative value in the second control interval Tb.

In comparison of FIG. 9 and FIG. 11, it may be identified that the simulation voltage formation unit of the power management integrated circuit simulates the inductor current IL with the first capacitor voltage ViL, and simulates the first switch current ISW with the second simulation voltage ISWT.

In a first example described with reference to FIG. 10 and FIG. 11, it has been described that the first simulation voltage VOT and the second simulation voltage ISWT are output through the individually formed first simulation voltage output terminal TVOT and second simulation voltage output terminal TISW. However, the first simulation voltage VOT and the second simulation voltage ISWT may be output through an existing terminal used in the power stage driving mode.

Figure 12:
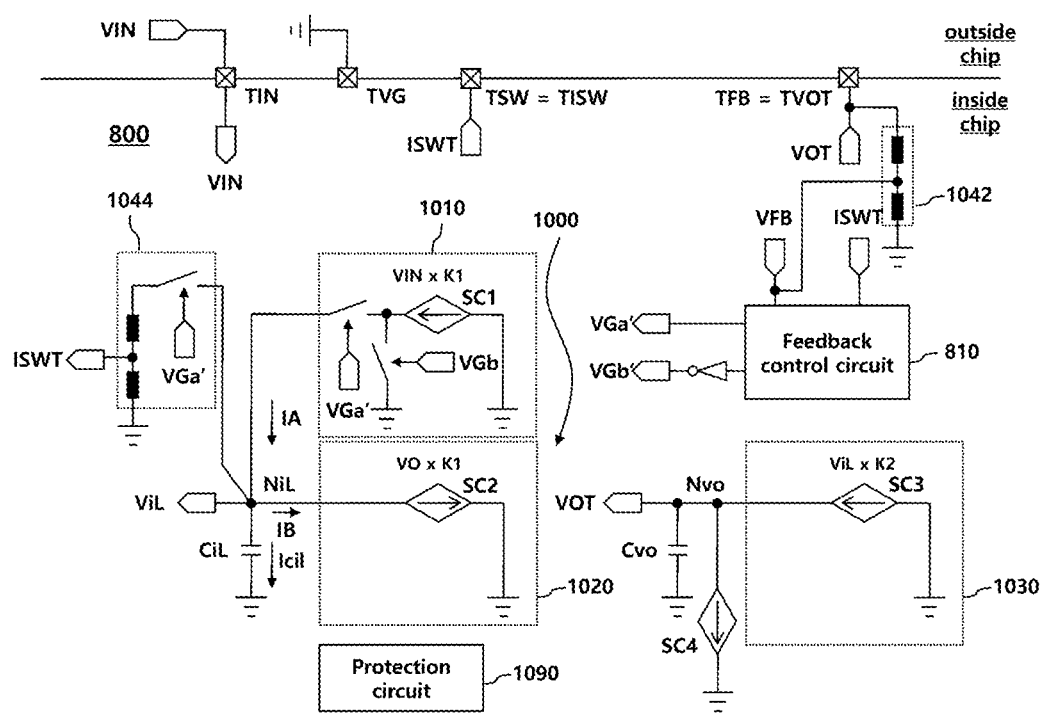
FIG. 12 is a second exemplary configuration diagram in which a test element is further added to the power management integrated circuit according to an embodiment.

FIG. 12 is a second exemplary configuration diagram in which a test element is further added to the power management integrated circuit according to an embodiment.

Referring to FIG. 12, the first simulation voltage VOT is output to the feedback terminal TFB, and the second simulation voltage ISWT is output to the switch node terminal TSW.

The feedback terminal TFB may be used to receive an input of a feedback voltage in the power stage driving mode, and may be used as a terminal to which the first simulation voltage VOT is output in the test mode.

Further, a sensing value of the inductor current may be input to the switch node terminal TSW in the power stage driving mode, and the second simulation voltage ISWT may be output to the switch node terminal TSW in the test mode. The sensing value of the inductor current may be input to the switch node terminal TSW only in a partial interval of the control period. For example, when current of the first switch is input to the switch node terminal TSW, it may be understood that the sensing value of the inductor current is input to the switch node terminal TSW only in the first control interval.

With reference to FIG. 10, it has been described that the second simulation voltage ISWT may be formed with the voltage of the first capacitor, which corresponds to the first control interval, but the second simulation voltage ISWT may be formed through the voltage of the first capacitor, which corresponds to all the control period.

As described with reference to FIG. 12, embodiments of the present specification may have the same terminals as those of the existing terminals and may operate in the power stage driving mode and the test mode.

According to the embodiments described above, the present disclosure may increase a test efficiency of a power management integrated circuit, lower test costs for the power management integrated circuit through a test device including no inductor, test the power management integrated circuit with low power, and shorten a test time by concurrently testing multiple power management integrated circuits.

Since terms, such as "including," "comprising," and "having" mean that corresponding elements may exist unless they are specifically described to the contrary, it shall be construed that other elements can be additionally included, rather than that such elements are omitted. All technical, scientific or other terms are used consistently with the meanings as understood by a person skilled in the art unless defined to the contrary. Common terms as found in dictionaries should be interpreted in the context of the related technical writings, rather than overly ideally or impractically, unless the present disclosure expressly defines them so.

Although embodiments of the present disclosure have been described for illustrative purposes, those skilled in the art will appreciate that various modifications, additions and substitutions are possible, without departing from the scope and spirit of the embodiment as disclosed in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A power management integrated circuit for regulating output voltage of a power stage using a switch, comprising:
    a feedback control unit configured to regulate voltage of an inductor included in said power stage by generating a gate controlling signal for said switch according to voltage of a feedback terminal connected to an voltage output part of said power stage in a power stage driving mode, and to generate a simulation controlling signal according to a simulation voltage formed inside said power management integrated circuit instead of the voltage of said feedback terminal in a test mode;
    a simulation voltage formation unit comprising a first capacitor to simulate said inductor and generating said simulation voltage by controlling current input into or output from said first capacitor according to said simulation controlling signal of said feedback control unit; and
    a simulation voltage output terminal to output said simulation voltage to an outside of said power management integrated circuit.

2. The power management integrated circuit of claim 1, wherein the simulation voltage formation unit simulates the voltage of the inductor with current input into or output from the first capacitor.

3. The power management integrated circuit of claim 2, wherein the simulation voltage formation unit comprises multiple current sources, and current input into or output from each of the current sources simulates voltage formed on one side of the inductor, voltage formed on another side of the inductor, or voltage formed on both sides of the inductor.

4. The power management integrated circuit of claim 2, wherein the simulation voltage formation unit simulates an output capacitor of the power stage with a second capacitor, and inputs into or outputs from the second capacitor, current simulating voltage of the first capacitor and current simulating a load of said power stage.

5. The power management integrated circuit of claim 1, wherein energy stored in the first capacitor is smaller than energy stored in the inductor.

6. The power management integrated circuit of claim 1, wherein said feedback terminal and said simulation voltage output terminal are a same one, a feedback voltage or the output voltage of said power stage is input to said simulation voltage output terminal in said power stage driving mode, and the simulation voltage is output to the simulation voltage output terminal in said test mode.

7. The power management integrated circuit of claim 1, wherein said gate controlling signal is substantially identical to said simulation controlling signal.

8. A power management integrated circuit for regulating output voltage of a power stage using a switch, comprising:
   a feedback control unit configured to regulate voltage of an inductor included in said power stage by generating a gate controlling signal for said switch according to voltage of a feedback terminal connected to an voltage output part of said power stage in a power stage driving mode, and to generate a simulation controlling signal according to a simulation voltage formed inside said power management integrated circuit instead of the voltage of said feedback terminal in a test mode;
   a simulation voltage formation unit comprising a first capacitor to simulate said inductor and generating said simulation voltage by controlling current input into or output from said first capacitor according to said simulation controlling signal of said feedback control unit; and
   a simulation voltage output terminal to output voltage of said first capacitor.

9. The power management integrated circuit of claim 8, wherein: in the power stage, an input voltage of the power stage is supplied to one side of the inductor, and the output voltage and a ground voltage are alternately supplied to another side of the inductor according to on/off of the switch; and the simulation voltage formation unit charges, throughout a control period, the first capacitor with a first current corresponding to the input voltage through a first current source, and discharges the first capacitor with a second current corresponding to the output voltage through a second current source in a first control interval, in which a first switch is turned off, in the control period.

10. The power management integrated circuit of claim 9, wherein, with respect to a second capacitor configured to simulate an output capacitor of the power stage, the simulation voltage formation unit supplies, through a third current source, a third current corresponding to the voltage of the first capacitor to a node connected to the second capacitor in the first control interval.

11. The power management integrated circuit of claim 10, wherein the simulation voltage formation unit performs control so that a fourth current source configured to simulate a load receives a fourth current from the node.

12. The power management integrated circuit of claim 8, wherein the simulation voltage output terminal outputs the voltage of the first capacitor only in a first control interval, in which a first switch is turned on, in a control period of the power stage.

13. The power management integrated circuit of claim 8, wherein a sensing value of the current of the inductor is input to the simulation voltage output terminal in said power stage driving mode, and the voltage of the first capacitor is output to the simulation voltage output terminal in said test mode.

14. The power management integrated circuit of claim 8, wherein: in the power stage, an input voltage of the power stage and a ground voltage are alternately supplied to one side of the inductor according to on/off of the switch, and the output voltage is supplied to another side of the inductor; and
   the simulation voltage formation unit charges the first capacitor with a first current corresponding to the input voltage through a first current source in a first control interval, in which said switch is turned off, in a control period, and discharges, throughout the control period, the first capacitor with a second current corresponding to the output voltage through a second current source.

15. The power management integrated circuit of claim 14, wherein, with respect to a second capacitor configured to simulate an output capacitor of the power stage, the simulation voltage formation unit supplies, through a third current source, a third current corresponding to the voltage of the first capacitor to a node connected to the second capacitor.

16. The power management integrated circuit of claim 15, wherein the simulation voltage formation unit performs control so that a fourth current source configured to simulate a load receives a fourth current from the node according to a predetermined clock.

* * * * *